United States Patent [19]
Akram et al.

[11] Patent Number: 5,483,741
[45] Date of Patent: Jan. 16, 1996

[54] METHOD FOR FABRICATING A SELF LIMITING SILICON BASED INTERCONNECT FOR TESTING BARE SEMICONDUCTOR DICE

[75] Inventors: Salman Akram, Boise; Warren M. Farnworth, Nampa; Alan G. Wood, Boise, all of Id.

[73] Assignee: Micron Technology, Inc., Boise, Id.

[21] Appl. No.: 335,267

[22] Filed: Nov. 7, 1994

Related U.S. Application Data

[60] Continuation-in-part of Ser. No. 206,747, Mar. 4, 1994, which is a division of Ser. No. 716,394, Sep. 3, 1993, Pat. No. 5,326,428.

[51] Int. Cl.⁶ ............................................. H05K 3/02
[52] U.S. Cl. .................. 29/846; 29/842; 156/630.1; 156/647.1; 156/654.1; 156/657.1; 156/659.11; 437/8
[58] Field of Search .................. 437/8; 156/630.1, 156/644.1, 647.1, 654.1, 657.1, 659.11; 29/846, 842

[56] References Cited

U.S. PATENT DOCUMENTS

| | | | |
|---|---|---|---|
| 4,312,117 | 1/1982 | Robillard et al. | |
| 4,585,991 | 4/1986 | Reid et al. | 156/647 X |
| 4,899,107 | 2/1990 | Corbett et al. | |
| 4,924,589 | 5/1990 | Leedy | 29/832 |
| 4,937,653 | 6/1990 | Blonder | 357/68 |
| 4,943,343 | 7/1990 | Bardai et al. | 156/644.1 X |
| 4,952,272 | 8/1990 | Okino et al. | 156/630.1 |
| 4,963,225 | 10/1990 | Lehman-Lamer | 156/630 |
| 5,051,379 | 9/1991 | Bayer et al. | 437/8 X |
| 5,072,116 | 12/1991 | Kawade et al. | 250/306 |
| 5,073,117 | 12/1991 | Malhi | 439/71 |
| 5,088,190 | 2/1992 | Malhi et al. | 29/843 |
| 5,103,557 | 4/1992 | Leedy | 29/832 |
| 5,116,460 | 5/1992 | Bukhman | 156/657.1 X |
| 5,123,850 | 6/1992 | Elder et al. | 439/67 |
| 5,173,451 | 12/1992 | Kinsman et al. | |
| 5,177,438 | 1/1993 | Littlebury et al. | 324/158 P |
| 5,177,439 | 1/1993 | Liu et al. | 324/158 P |
| 5,207,585 | 5/1993 | Byrnes et al. | |
| 5,302,891 | 4/1994 | Wood et al. | |
| 5,323,035 | 6/1994 | Leedy | 257/248 |
| 5,326,428 | 7/1994 | Farnworth et al. | 156/654 |
| 5,408,190 | 4/1995 | Wood et al. | 324/765 |
| 5,419,807 | 5/1995 | Akram et al. | 437/8 |

FOREIGN PATENT DOCUMENTS

| | | | |
|---|---|---|---|
| 60-198838 | 10/1985 | Japan | 437/8 |
| 3-69131 | 3/1991 | Japan | |

*Primary Examiner*—Carl J. Arbes
*Attorney, Agent, or Firm*—Stephen A. Gratton

[57] ABSTRACT

A method for forming a self-limiting, silicon based interconnect for making temporary electrical contact with bond pads on a semiconductor die is provided. The interconnect includes a silicon substrate having an array of contact members adapted to contact the bond pads on the die for test purposes (e.g., burn-in testing). The interconnect is fabricated by: forming the contact members on the substrate; forming a conductive layer on the tip of the contact members; and then forming conductive traces to the conductive layer. The conductive layer is formed by depositing a silicon containing layer (e.g., polysilicon, amorphous silicon) and a metal layer (e.g., titanium, tungsten, platinum) on the substrate and contact members. These layers are reacted to form a silicide. The unreacted metal and silicon containing layer are then etched selective to the conductive layer which remains on the tip of the contact members. Conductive traces are then formed in contact with the conductive layer using a suitable metallization process. Bond wires are attached to the conductive traces and may be attached to external test circuitry. Alternately, another conductive path such as external contacts (e.g., slide contacts) may provide a conductive path between the conductive traces and external circuitry. The conductive layer, conductive traces and bond wires provide a low resistivity conductive path from the tips of the contact members to external test circuitry.

29 Claims, 6 Drawing Sheets

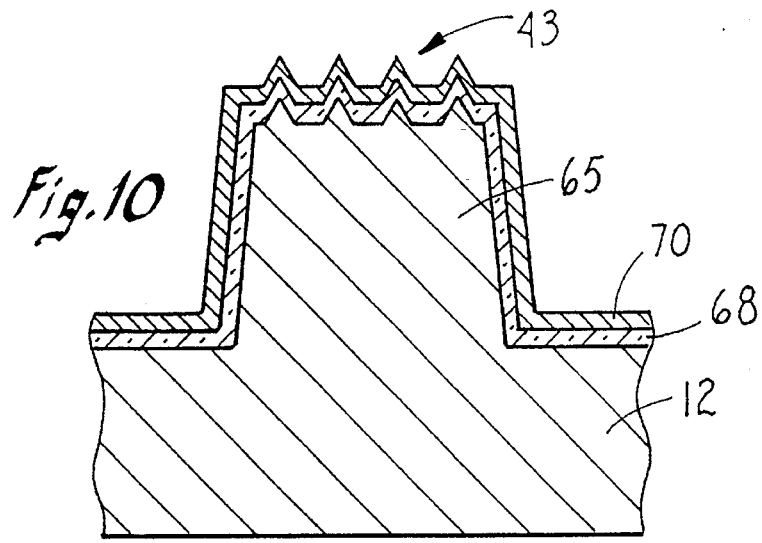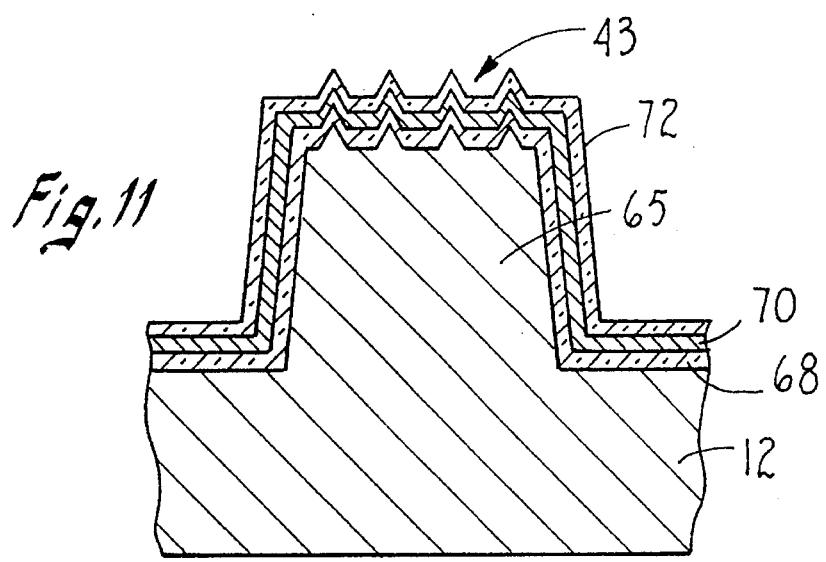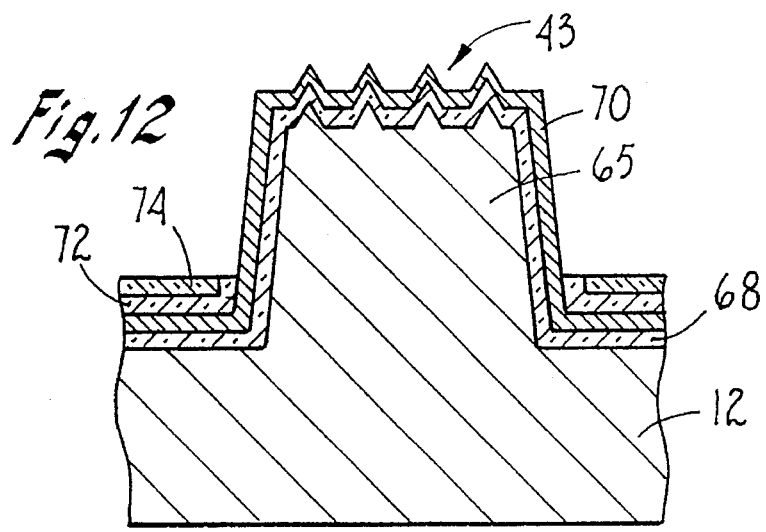

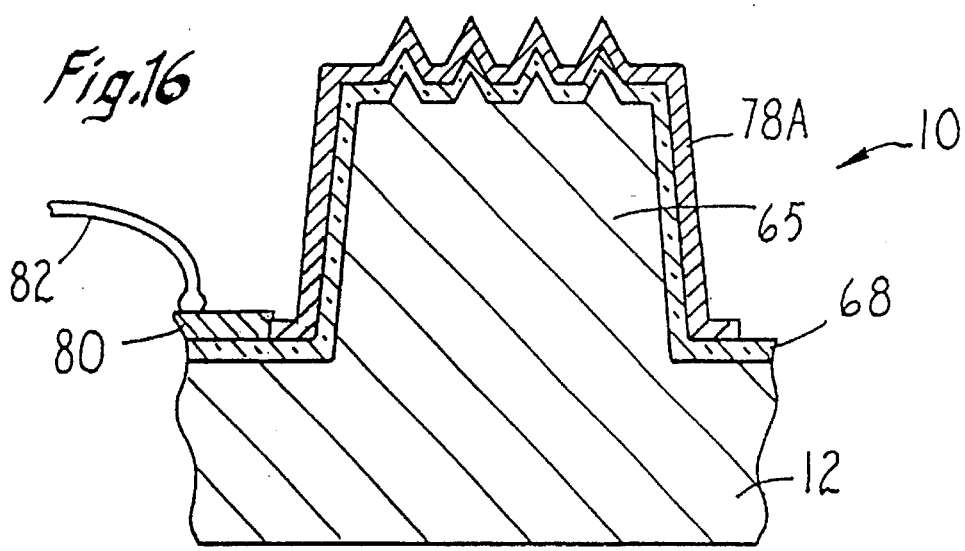
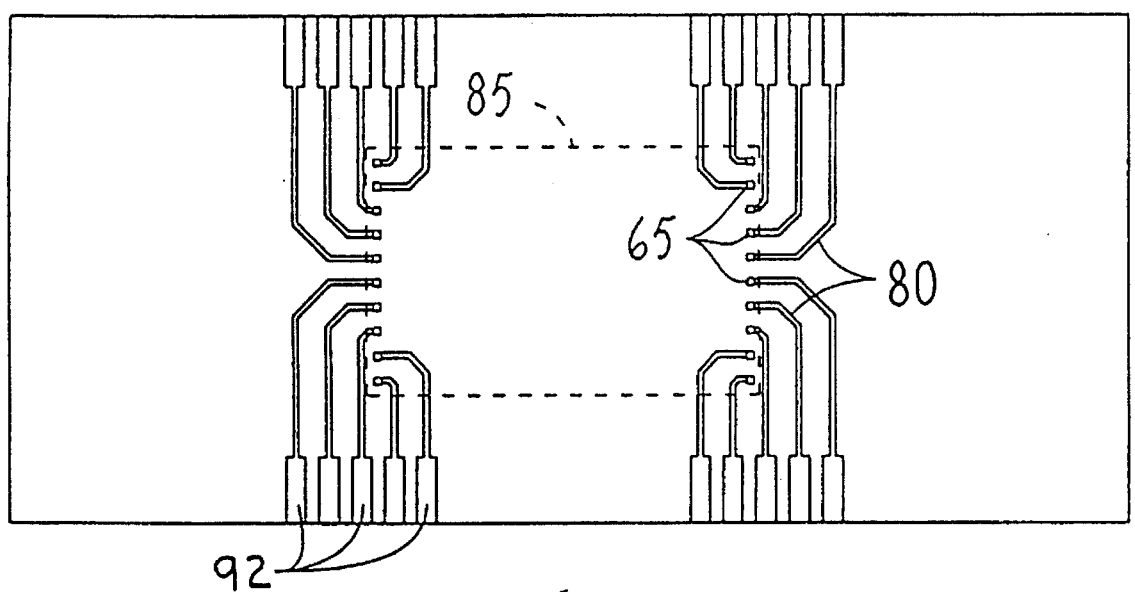

METHOD FOR FABRICATING A SELF LIMITING SILICON BASED INTERCONNECT FOR TESTING BARE SEMICONDUCTOR DICE

CROSS REFERENCE TO RELATED APPLICATIONS

This application is a continuation-in-part of application Ser. No. 08/206,747 filed Mar. 4, 1994 which is a division of application Ser. No. 08/716,394 filed on Sep. 3, 1993, U.S. Pat. No. 5,326,428.

FIELD OF THE INVENTION

This invention relates generally to semiconductor manufacture and more particularly to methods for fabricating an interconnect suitable for testing the operability of integrated circuitry on a bare, discrete semiconductor die.

BACKGROUND OF THE INVENTION

One of the fastest growing segments of the semiconductor industry is the manufacture of multi-chip modules (MCM). Multi-chip modules are being increasingly used in computers to form PC chip sets and in telecommunication items such as modems and cellular telephones. In addition, consumer electronic products such as watches and calculators typically include multi-chip modules.

With a multi-chip module, non-encapsulated dice (i.e., chips) are secured to a substrate using an adhesive. Electrical connections are then made directly to the bond pads on each die and to electrical leads on the substrate. The multi-chip module is favored because it provides significant cost and performance characteristics over packaged dice. It has been estimated that by the year 2000, 25% of all dice will be utilized in their bare or unpackaged form.

In view of the trend towards multi-chip modules, semiconductor manufacturers are required to supply unencapsulated dice that have been tested and certified as known good die (KGD). This has led to the development of test apparatus suitable for testing individual or discrete semiconductor die. As an example, test apparatus for conducting burn-in tests for discrete die are disclosed in U.S. Pat. No. 4,899,107 to Corbett et al. and U.S. Pat. No. 5,302,891 to Wood et al., which are assigned to Micron Technology, Inc. Other test apparatus for discrete die are disclosed in U.S. Pat. No. 5,123,850 to Elder et al., and U.S. Pat. No. 5,073,117 to Malhi et al., which are assigned to Texas Instruments.

With this type of test apparatus, a non-permanent electrical connection must be made between the bond pads or other contact locations on a bare, discrete die and the external test circuitry of the test apparatus. The bond pads provide a connection point for testing the integrated circuitry of the die. Bond pads on semiconductor dice are typically formed of either aluminum, gold or solder using different pad metallurgies. Furthermore, a bond pad may have a flat planar configuration or it may be formed as a raised bump.

The test apparatus for discrete die employ different techniques for making a non permanent connection to the bond pads of the die. As an example, the previously cited Wood et al. device employs a die contact member that utilizes non-bonded TAB (tape automated bonding) technology. The Elder et al. device utilizes a flexible interconnect member having an arrangement of probe bumps or members for contacting the bond pads. The Malhi et al. device uses an arrangement of cantilevered probe tips to contact the bond pads.

Alternately, non permanent wire bonding may be employed to effect the electrical connection. U.S. Pat. No. 5,173,451 to Kinsman assigned to Micron Technology, Inc. describes a method in which each die is mounted in a carrier and bond wires are non permanently attached to the bond pads using ultrasonic wedge bonding. The carrier and die are placed in the test apparatus and the bond wires are connected to external test circuitry for testing the integrated circuits on the die. Following completion of the test procedure, the temporary bond wires are separated from the bond pads and the die is separated from the carrier.

In addition to wire bonding, TAB connections and probe tips, other interconnect structures have been used to connect the bond pads on a die with the circuitry of a test apparatus. As an example, U.S. Pat. No. 5,177,439 to Liu et al., describes a test apparatus that includes a probe card for making electrical contact with the bond pads of a die. The probe card is an interconnection structure formed of a semiconducting material such as silicon. The Liu probe card includes pointed silicon protrusions coated with a conductive film for contacting the bond pads. U.S. Pat. No. 5,207,585 to Byrnes et al. describes an interconnect structure formed as a flexible pellicle having electrodes for making a temporary connection with bond pads formed as a flat pad or as a conductive bump.

Regardless of which bond pad connection technique is employed, it is desirable to effect a connection that causes as little damage as possible to the bond pad. If the temporary connection to a bond pad damages the pad, the entire die may be rendered as defective. This is difficult to accomplish because the connection must also produce a low resistance or ohmic contact with the bond pad. A bond pad typically includes a metal oxide layer that must be penetrated to make an ohmic contact. Some prior art interconnect structures, such as probe cards, scrape the bond pads which wipes away this oxide layer and causes excessive damage to the bond pads. Probe tips may pierce both the oxide layer and the metal bond pad and leave a deep gouge. Other interconnect structures, such as probe bumps, may not even pierce the oxide layer preventing the formation of an ohmic contact.

Another important consideration in KGD testing is the effect of thermal expansion during the test procedure. During burn-in testing, a die is heated to an elevated temperature. This causes thermal expansion of the die and test fixture. If the bond pads and the interconnect structure expand by a different amount, stress may develop between these components and adversely effect the electrical connection there between. This may also lead to excessive damage of bond pads.

In general, current physical testing apparatus for testing discrete semiconductor die have become the limiting factor in providing KGD at optimal yields. As is apparent, improved testing methods and structures for discrete die are needed in the art that are cost effective and that can be incorporated into the existing technology of large scale semiconductor manufacture.

Accordingly, it is an object of the present invention to provide an improved method for fabricating temporary interconnects for testing discrete semiconductor dice. It is a further object of the present invention to provide an improved method for fabricating temporary interconnects that is compatible with large scale semiconductor manufacture and that provides an improved interconnect structure. It is yet another object of the present invention to provide an improved method for fabricating temporary interconnects that are characterized by contact members having a conductive tip and a low resistance conductive trace for connection to external test circuitry.

SUMMARY OF THE INVENTION

In accordance with the present invention, a method of fabricating a temporary interconnect suitable for use in testing bare, discrete semiconductor dice is provided. The interconnect includes a silicon substrate having projecting contact members adapted to contact bond pads or other contact locations on a die. The contact members are formed integrally with the substrate in a pattern that matches the size and spacing of the bond pads on the die. The tip of each contact member is covered with a conductive layer. The conductive layer may be formed of a metal or a silicide. Conductive traces or runners are formed in electrical contact with the conductive layer. Bond wires are attached to the conductive traces to provide a conductive path to external test circuitry. In addition, the tip of each contact member includes one or more raised projections covered with the conductive layer and adapted to pierce the bond pads of the die to establish an ohmic contact. In an illustrative embodiment the raised projections are formed as sharpened blades or knife edges. The penetration depth of the raised projections into the bond pad is self-limiting by the dimensions and structure of the contact members and raised projections. Specifically, a top surface of the contact members acts as a penetration stop plane for the raised projections.

The method of the invention, generally stated, comprises a method for forming the contact members, the conductive layer on the tips of the contact members and the conductive traces to the conductive layer. The conductive layer formed at the tip of each contact member, is separated from the silicon substrate of the interconnect by an insulating layer. For forming a silicide conductive layer, a silicon containing layer (e.g., polysilicon, amorphous silicon) and a metal layer (e.g., platinum, titanium) may be deposited on the contact member and reacted to form a silicide (e.g., $PtSi_2$, $TiSi_2$). The silicon containing layer and the metal layer are then removed by etching selectively with respect to the silicide layer. Following formation of the silicide layer, a conductive layer (e.g., aluminum) is deposited (making contact to the silicide layer) and patterned to form the conductive traces.

Preferably a large number of interconnects are formed on a single substrate or wafer. This substrate can then be diced (e.g., saw cut) to singulate the interconnects.

The method of the invention stated in detail comprises the steps of: forming an array of raised contact members on a substrate each having a projecting apex (e.g., knife edge, pointed projection) for penetrating a bond pad of the die; forming an insulative layer (e.g., oxide) on the contact members and substrate; forming a silicon containing layer on the insulating layer; forming a second insulating layer over the silicon containing layer; removing the second insulating layer on the contact member to expose the underlying silicon containing layer; depositing a first metal layer on the contact members and substrate; sintering the first metal layer and the silicon containing layer to form a silicide layer; selectively etching the first metal layer selective to the silicide layer to leave the contact member covered by the silicide layer; selectively etching the second insulating layer and silicon containing layer selective to the silicide layer; depositing a second metal layer on the substrate in contact with the silicide layer; and then etching the second metal layer from selected areas to form conductive traces in contact with the silicide layer.

One advantage of this process is that it allows the contact members to be easily formed with a self aligned, low resistivity silicide layer. In addition, this process employs standard photoresist patterning methods, providing simplicity and cost reduction. Furthermore, the conductive traces to the silicide layer have a low resistivity. Other objects, advantages and capabilities of the present invention will become more apparent as the description proceeds.

BRIEF DESCRIPTION OF THE DRAWINGS

FIG. 10 is a schematic cross sectional view showing another step in the method of the invention for forming a conductive silicide layer on the tip on the contact member;

FIG. 11 is a schematic cross sectional view showing another step in the formation of the silicide layer;

FIG. 12 is a schematic cross sectional view showing another step in the formation of the conductive silicide layer;

FIG. 16 is a schematic cross sectional view showing an alternate embodiment of the completed contact member and conductive traces; and FIG. 17 is a plan view of the completed interconnect with a die superimposed thereon.

DETAILED DESCRIPTION OF THE PREFERRED EMBODIMENT

Figure 1:
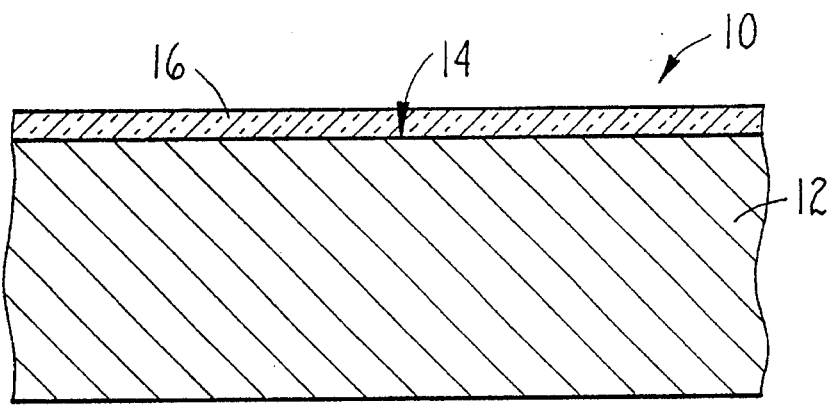
FIG. 1 is a schematic cross sectional view of a portion of a semiconductor substrate showing an initial process step for forming an interconnect in accordance with the invention.

Referring now to FIG. 1, a process for forming an interconnect 10 for testing discrete semiconductor die is shown. The interconnect 10 includes a substrate 12 formed of a semiconducting material such as monocrystalline silicon. The substrate 12 includes a planar outer surface 14 having a mask layer 16 of a material such as silicon nitride ($Si_3N_4$) formed thereon. A typical thickness for the mask layer 16 is about 500 Å to 3000 Å. The mask layer 16 may be formed using a suitable deposition process such as CVD.

Figure 2:
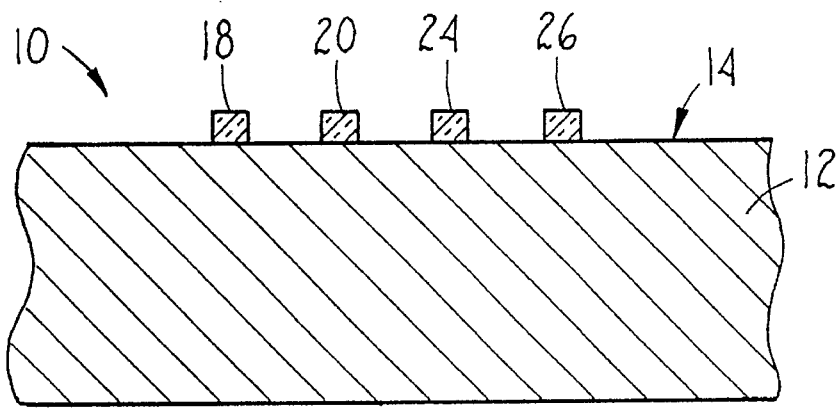
FIG. 2 is a schematic cross sectional view of the substrate showing another step of the method of the invention.

Next, as shown in FIG. 2, the mask layer 16 is patterned and etched selective to the substrate 12 to form a hard mask that includes masking blocks 18, 20, 24 and 26. Depending on the materials used for the mask layer 16 this etch step may be performed using a wet or dry etch. As an example, a layer of silicon nitride may be etched using hot (e.g., 180° C.) phosphoric acid.

Figure 3:
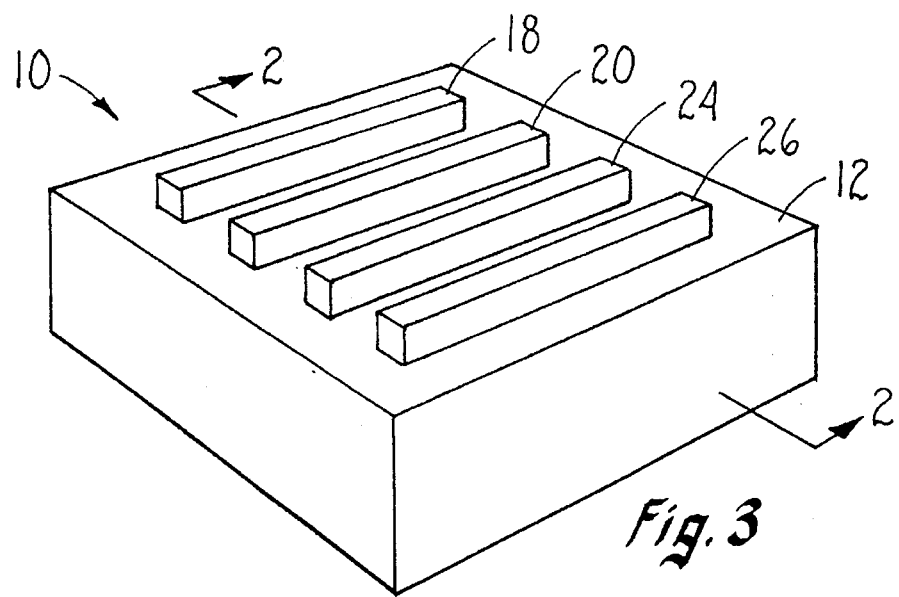
FIG. 3 is a plan view of FIG. 2.

As shown in the plan view of FIG. 3, the masking blocks 18, 20, 24 and 26 are formed in a parallel spaced array and are sized and shaped to fit within the perimeters of a generally rectangular or square shaped bond pad of a semiconductor die (e.g., 100 µm×100 µm). As is apparent, such a parallel spaced array is merely exemplary and other configurations are possible. Other suitable arrangements for the masking blocks include enclosed rectangles, squares triangles, T-shapes and X-shapes.

Figure 4:
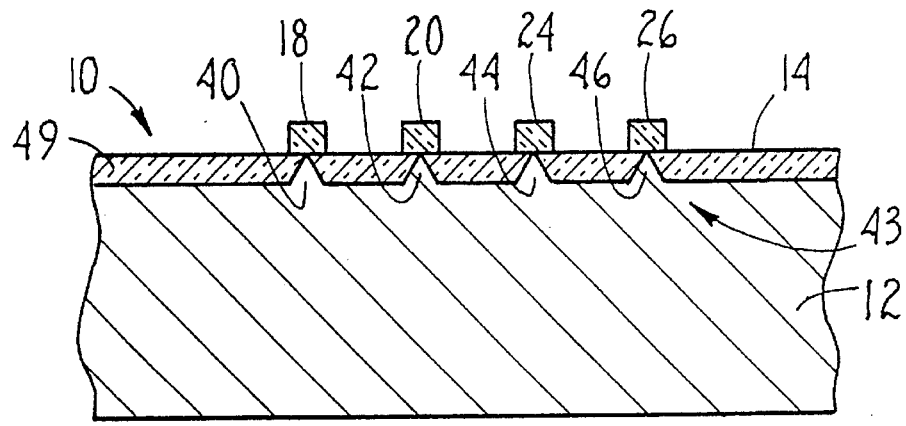
FIG. 4 is a schematic cross sectional view of the substrate showing another step in the method of the invention.
Figure 5:
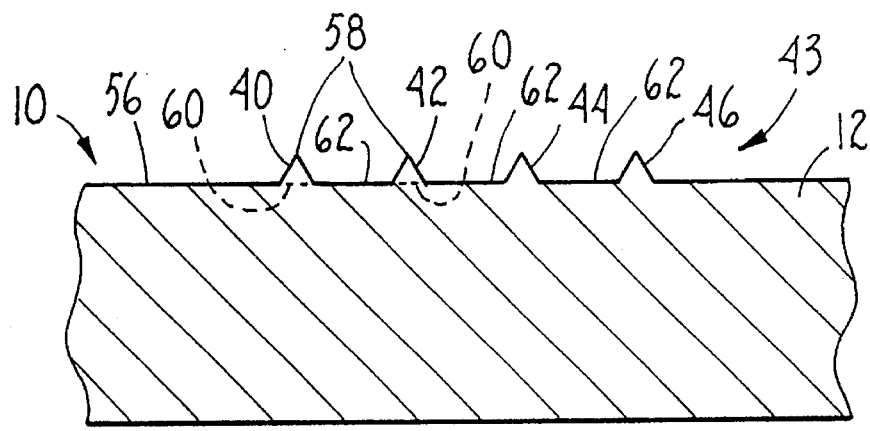
FIG. 5 is a schematic cross sectional view of the substrate showing another step in the method of the invention.

Next, as shown in FIG. 4, a wet or dry isotropic or anisotropic etch process is used to form projecting apexes 40, 42, 44, 46 on the substrate. For an anisotropic etch, in which the etch rate is different in different directions, an etchant solution containing a mixture of KOH and $H_2O$ may be utilized. This isotropic etch results in the formation of triangular tips as shown in FIG. 5. This is a result of the different etch rates of monocrystalline silicon along the different crystalline orientations. For an isotropic etch, in which the etch rate is the same in all directions, an etchant solution containing a mixture of HF, $HNO_3$ and $H_2O$ may be utilized.

Alternately, in place of an isotropic or anisotropic etch process, the substrate may be subjected to an oxidizing atmosphere to oxidize portions of the substrate 12 not covered by the masking blocks 18, 20, 24, 26, of the mask layer 16. As an example, the oxidizing atmosphere may comprise steam and $O_2$ at an elevated temperature (e.g. 950° C.). The oxidizing atmosphere oxidizes the exposed portions of the substrate 12 and forms an insulating layer 49 (e.g., silicon dioxide). At the same time, projecting apexes 40, 42, 44 and 46 are formed under the masking blocks. The projecting apexes 40, 42, 44, 46 may also be formed by a deposition process out of a different material than the substrate 12.

Next, as shown in FIG. 5, the masking blocks 18, 20, 24, 26 are stripped using a wet etchant such as $H_3PO_4$ that is selective to the substrate 12. With an oxidizing process the insulating layer 49 is stripped using a suitable wet etchant such as HF.

Figure 6:
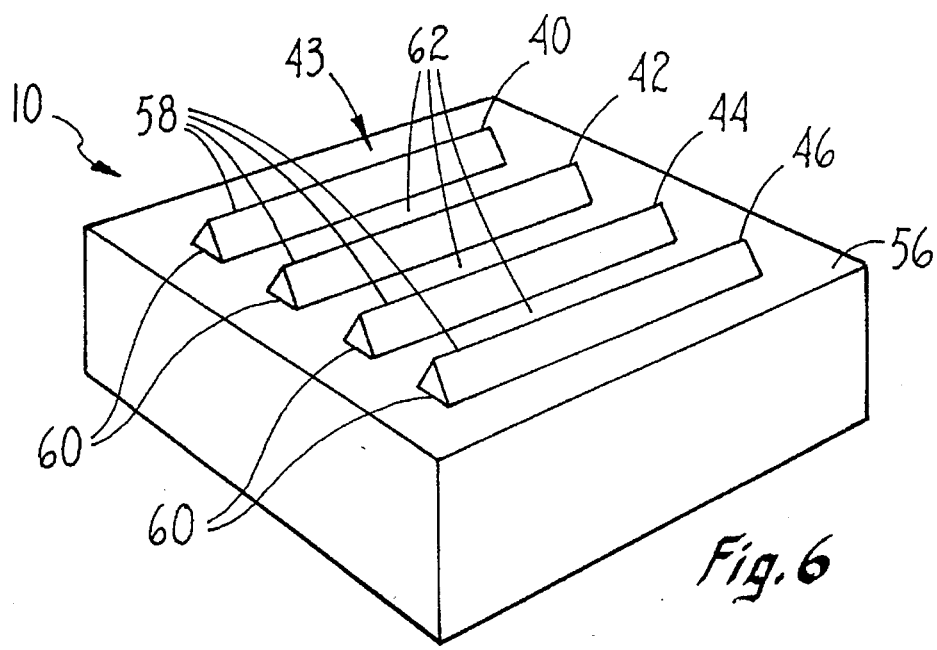
FIG. 6 is a plan view of FIG. 5.

Thus as shown in to FIG. 6, the steps of patterning and etching and stripping form projecting apexes 40, 42, 44, 46 which are in the form of parallel spaced knife edges. The projecting apexes 40, 42, 44, 46 form an apex group 43 which has an overall peripheral dimension which falls within the boundaries of a generally rectangular or square bond pad of a semiconductor die. Although multiple knife edges are formed for each bond pad, it is to be understood that a single knife edge per bond pad would also be suitable.

The projecting apexes 40, 42, 44, 46 project from a surface 56 of the substrate 12 and include tips 58 and bases 60. Bases 60 of adjacent projecting apexes 40, 42, 44, 46 are spaced from one another a distance sufficient to define a penetration stop plane 62 there between. Example spacing between apexes would be 10 µm, while an example length of an individual stop plane 62 would be from 3 to 10 µm. The function of the penetration stop plane 62 will be apparent from the continuing discussion. The tip 58 and base 60 of each projecting apex 40, 42, 44, 46 are spaced apart by a projecting distance that is preferably about one-half the thickness of a bond pad on a semiconductor die. As an example, this projecting distance will be on the order of 0.5 to 1 µm. Subsequent to formation of the projecting apexes 40, 42, 44, 46, 48 additional etching may be used to further sharpen the apexes 40, 42, 44, 46.

Figure 7:
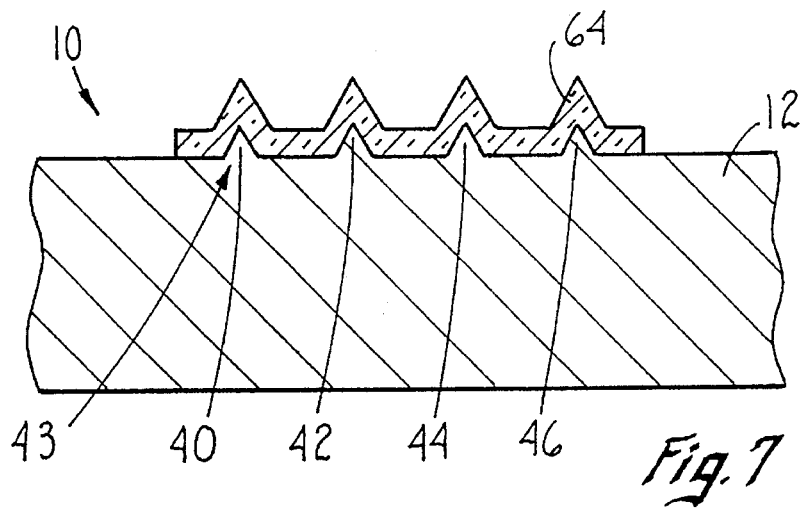
FIG. 7 is a schematic cross sectional view of the substrate showing another step in the method of the invention.
Figure 8:
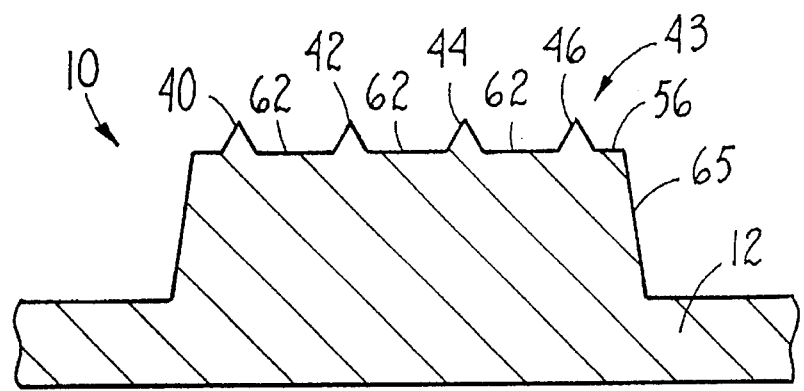
FIG. 8 is a schematic cross sectional view of the substrate showing another step in the method of the invention.
Figure 9:
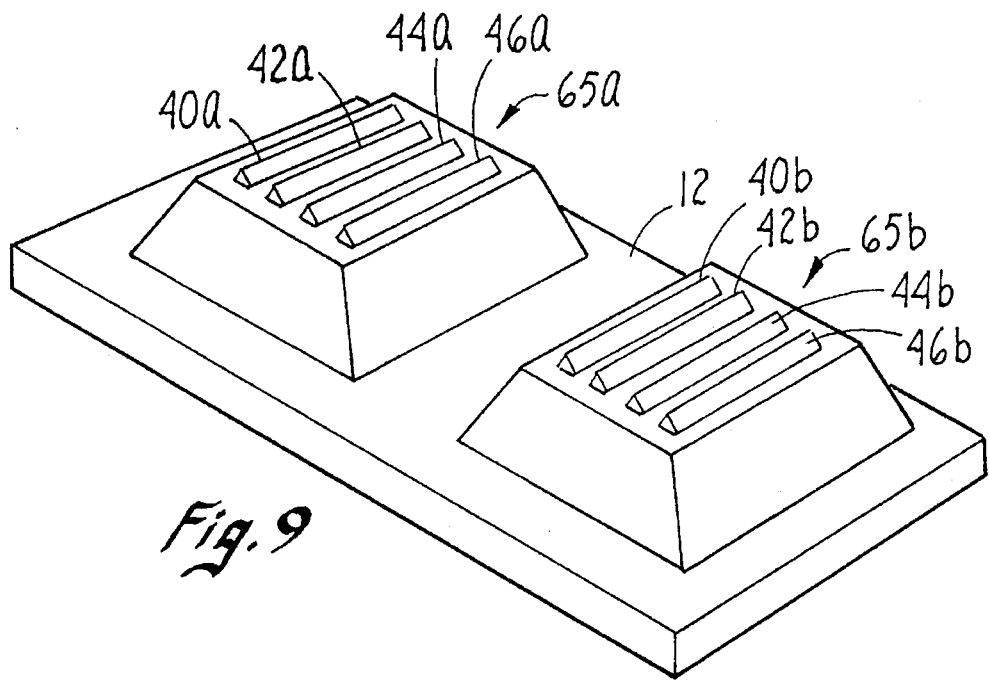
FIG. 9 is a schematic perspective view showing another step in the method of the invention illustrating partially completed contact members.

Next, as shown in FIG. 7, all of the projecting apexes 40, 42, 44, 46 in apex group 43 are covered with a nitride masking layer 64 and photopatterned. Then as shown in FIG. 8, the substrate 12 is etched around the masking layer 64 to form raised contact members 65. Typical etching techniques comprise wet anisotropic etching with a mixture of $KOH:H_2O$. This type of etching is also known in the art as bulk micromachining. The contact members 65 are sized and shaped to contact a bond pad of a semiconductor die. Each contact member 65 viewed from above has a generally square rectangular peripheral configuration and is dimensioned to fall within the perimeter of a bond pad. The contact members 65 can also be formed in other peripheral configurations such as triangles, polygons or circles. The height of each contact member 65 will be on the order of 50–100 µm and the width on each side about 40–80 µm. FIG. 9 shows two adjacent contact members 65a and 65b extending from the substrate. The spacing of the contact members 65a and 65b matches the spacing of adjacent bond pads on a semiconductor die (e.g., 50 to 100 µm).

The method of the invention is adapted to form a conductive silicide layer 78A (FIG. 14) on the tip of each contact member 65. In addition, conductive traces 80 (FIG. 14) are formed to provide a conductive path to the silicide layer 78A (FIG. 14). This segment of the process is illustrated in FIGS. 10–14.

Initially, as shown in FIG. 10, an insulating layer 68 (e.g., $SiO_2$), is formed on the substrate 12 and contact members 65. The insulating layer 68 is formed by oxidation of the substrate 12 and may be accomplished by exposing the substrate 12 and to an oxidizing atmosphere for a short time. $SiO_2$ can also be deposited using CVD. Another commonly used insulator suitable for this purpose is $Si_3N_4$.

As also shown in FIG. 10, a silicon containing layer such as polysilicon layer 70 is formed on the insulating layer 68. The polysilicon layer 70 is required to form a silicide with a metal layer 78 (FIG. 13) during subsequent processing. The polysilicon layer 70 may be formed of doped or undoped polysilicon. Alternately, other silicon containing layers such as doped or undoped amorphous silicon may be employed in place of polysilicon. However, polysilicon is preferred for most applications because of lower resistivity and better electrical and structural properties and because it lends itself to simpler etching processes. The polysilicon layer 70 may be deposited on the insulating layer 68 using a suitable deposition process such as chemical vapor deposition (CVD) or by using an epitaxial growth process. A typical thickness for the polysilicon layer 70 would be from about 500 Å to 3000 Å.

Next, as shown in FIG. 11, a second insulating layer 72 (e.g., $SiO_2$) is formed on the polysilicon layer 70. The second insulating layer 72 may be deposited using CVD techniques or formed by exposing the polysilicon layer 70 to an oxidizing environment. A typical thickness for the second insulating layer 72 would be from about 500 Å to 3000 Å.

Next, as shown in FIG. 12, a layer of photoresist 74 is formed on the substrate 12 by spin-on or other suitable deposition process. The photoresist 74 is then developed such that the contact members 65 are exposed. This is relatively easy to accomplish because the photoresist 74 will tend to puddle on the lower portions of the structure, such as surface of the substrate 12, leaving the projecting contact members 65 exposed.

Following development of the photoresist 74, the second insulating layer 72 (FIG. 11) on the contact member 65 is removed leaving the polysilicon layer 70 exposed on the tip of the contact member 65. This may be accomplished using a dry etch process with a chlorine or fluorine based etchant such as $CF_4$, $CHF_3$, $C_2F_6$, or $C_3F_8$.

Figure 13:
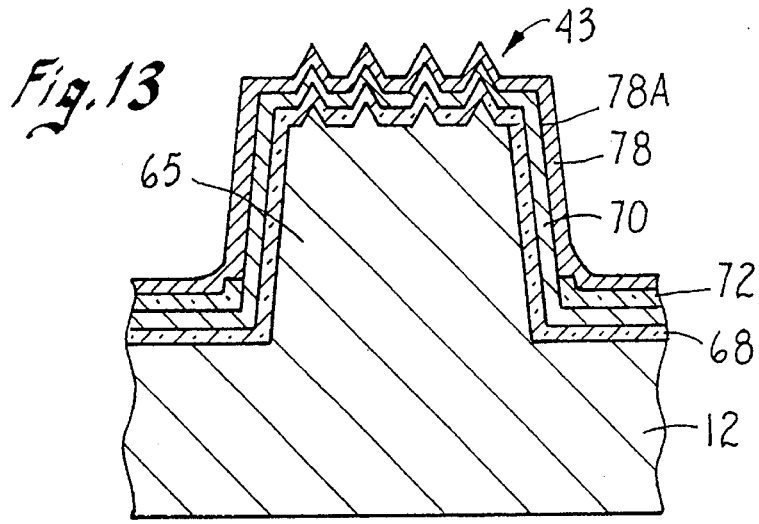
FIG. 13 is a schematic cross sectional view showing another step in the formation of the silicide layer.
Figure 14:
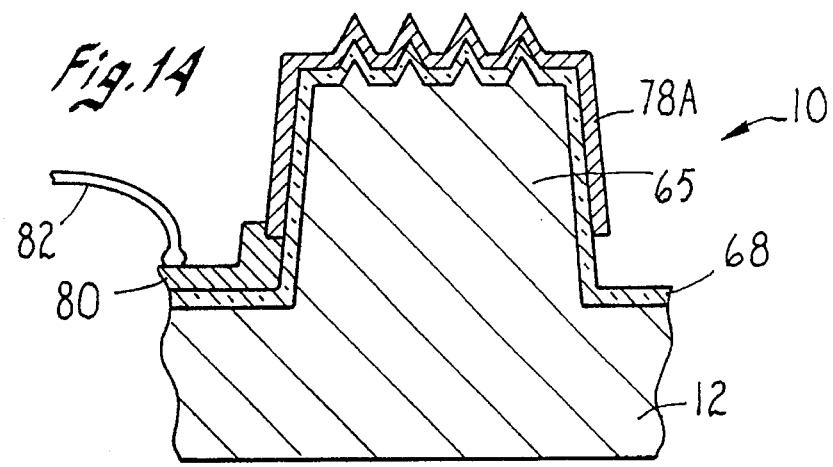
FIG. 14 is a schematic cross sectional view showing the completed contact member and conductive traces.

Next, as shown in FIG. 13, the photoresist 74 is removed and a metal layer 78 is deposited on the exposed polysilicon layer 70. The metal layer 78 covers the polysilicon layer 70 on the tip and sidewalls of the contact member 65 and completely covers the apex group 43. In addition, the metal layer 78 covers the second insulating layer 72 on the substrate 12. The metal layer 78 can be deposited to a thickness of about 500 Å to 3000 Å using a suitable deposition process such as low pressure chemical vapor deposition (LPCVD), or using standard metal sputtering or evaporation techniques.

The metal layer 78 is formed of a metal that will react with the polysilicon layer 70 to form a metal silicide. Suitable metals include the refractory metals, such as titanium (Ti), tungsten (W), tantalum (Ta), platinum (Pt) and molybdenum (Mo). In general, silicides of these metals ($WSi_2$, $TaSi_2$, $MoSi_2$, $PtSi_2$ and $TiSi_2$) are formed by alloying with a silicon surface. Other suitable metals include cobalt (Co), nickel (Ni), molybdenum (Mo), copper (Cu), gold (Au) and iridium (Ir).

Following deposition of the metal layer 78, a sintering process is performed in which the metal layer 78 is heated and reacts with the polysilicon layer 70 to form a silicide. This type of sintering process is also known in the art as salicide sintering. Such a salicide sintering step can be performed by heating the polysilicon layer 70 and metal layer 78 to a temperature of about 650° to 820° C. for typical thicknesses in thousands of angstroms (e.g., 2000Å–3000Å). This sintering process can be performed in one single step or using multiple temperature steps. A silicide layer 78A forms at the interface of the metal layer 78 and the polysilicon layer 70.

Next, as shown in FIG. 14, the unreacted portions of the metal layer 78 and the polysilicon layer 70 are removed while the silicide layer 78A is left at the tip of the contact member 65. This can be done by etching the metal layer 78 and the polysilicon layer 70 selective to the silicide layer 78A. By way of example for $TiSi_2$, for etching the unreacted portion of a titanium metal layer 78, a wet etchant such as a solution of ammonia and hydrogen peroxide, or a $H_2SO_4$, $H_2O_2$ mixture, that will attack the metal layer 78 and not the silicide layer 78A, can be used. Alternately, a dry etch process with an etchant species such as $Cl_2$ or $BCl_3$ can be used to etch the metal layer 78 selective to the silicide layer 78A.

For etching the unreacted portion of the polysilicon layer 70 selective to the silicide layer 78A, a wet etchant such as an $HF:HNO_3:H_2O$ acid mixture (typical ratios of 1:10:10) can be used to remove the unreacted portion. A wet isotropic etchant can also be used for this purpose. Alternately the polysilicon layer 70 may etched selective to the silicide layer 78A using a dry etch process and an etchant such as $NF_3$ at low pressures (typically 30 m torr) or $CL_2$ and HBr at 130 m torr. The remaining second insulating layer 72 on the substrate 12 needs to be etched away prior to the polysilicon etch described above. This can be accomplished using a dry etch process as previously described. As shown in FIG. 14, the completed interconnect 10 includes the silicide layer 78A which covers the tip of the contact member 65 and the apex group 43 and a portion of the sidewalls of the contact member 65. Alternately, the silicide layer 78A can be extended to cover part of the base of the contact member 65 as shown in FIG. 16.

The resistivity of the silicide layer 78A may be lowered using an annealing process. This may be accomplished by heating the substrate 12 and silicide layer 78A to a temperature of between about 780° C. to 850° C. for several minutes.

As also shown in FIG. 14, conductive traces 80 may be formed on the substrate 12 to provide a conductive path in electrical contact with the silicide layer 78A. The conductive traces 80 are formed by depositing and etching a second metal layer comprising a highly conductive metal such as aluminum, copper or alloys thereof, or a refractory metal such as titanium, tungsten, tantalum and molybdenum or alloys of these metals. Other conductive materials such as polysilicon may also be employed to form the conductive traces 80. The conductive traces 80 may be formed using a standard metallization process such as a blanket CVD deposition or sputtering followed by photopatterning and etching. As an example, a wet etchant such as $H_3PO_4$ can be used to etch a patterned aluminum layer selectively from desired areas on substrate 12 to form aluminum conductive traces 80.

FIG. 17 shows an exemplary layout for the conductive traces 80 and contact members 65 in the completed interconnect 10. Such a layout will depend on the bond pad configuration of a die under test. Preferably a large number of interconnects 10 can be formed using semiconductor circuit fabrication techniques on a single substrate or wafer (not shown). The wafer can then be sawed (i.e., diced) to singulate the interconnects 10.

Referring back again to FIG. 14, bond wires 82 are wire bonded to the conductive traces 80 utilizing a conventional wire bonding process (e.g., solder ball) to provide a conductive path from the completed interconnect 10 to external test circuitry. As shown in FIG. 17, each conductive trace includes a bonding site 92 for wire bonding the bond wires 82. In place of a wire bonding process other conductive paths such as external connector pads, slide connectors and other mechanical connector arrangements may be utilized (not shown).

Figure 15:
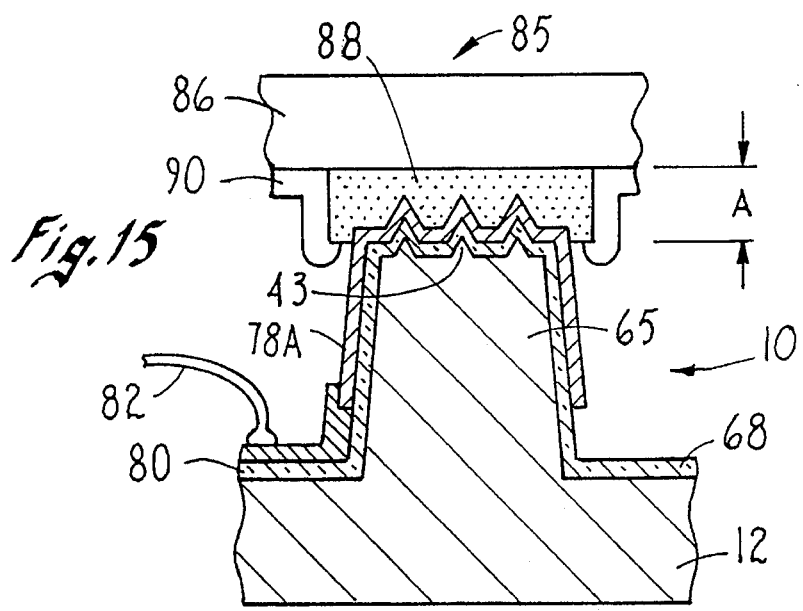
FIG. 15 is a schematic cross sectional view showing an interconnect constructed in accordance with the invention in electrical contact with the bond pads of a semiconductor die during testing of the die.

Referring now to FIG. 15, the interconnect 10 is shown engaging a semiconductor die 85 as a die under test (DUT). The die 85 includes a substrate 86 and an arrangement of exposed bond pads 88. A protective layer 90 covers the die 85 such that only the bond pads 88 are exposed. The bond pads 88 have a thickness of "A" and may be covered by a thin layer of oxide (not shown) depending on the metallization used for the bond pads.

In use of the interconnect 79, the projecting apexes 40, 42, 44, 46, represented by apex group 43 of a contact member 65, pierce the bond pad 88 and its oxide coating. The penetration of the apex group 43 is limited by the stop plane 62 (FIG. 8) formed by the surface of the contact member 65. The force required to press the apex group 43 into the bond pad 88 can also be monitored as an indication of the penetration depth. Optimally, the apex group 43 extends about half way through the thickness of the bond pad 88 (i.e., ½ of the distance A in FIG. 15). This provides a low resistance ohmic contact between the silicide layer 78A and the bond pad 88. At the same time a penetration depth into the bond pad 88 is limited by the dimensions of the projecting apexes 40, 42, 44, 46 and by the stop plane provided by the top surface of the raised constant member 65.

The conductive trace 80 and bond wire 82 provide a connection from the silicide layer 78A to test circuitry for testing the die 85. As an example, the opposite end of the bond wire 82 may be connected to a temporary holder for the die 85 adapted to be placed along with the interconnect 10 in a test apparatus (not shown). The test apparatus may include a connection to the temporary-holder and to test circuitry. Such an arrangement is described in more detail in U.S. Pat. No. 5,302,891 entitled "Discrete Die Burn-In For Non-Packaged Die". This patent as well as those previously cited are incorporated herein by reference.

Thus the invention provides a method for forming an interconnect useful in establishing an electrical connection to the bond pads of a semiconductor die for testing and other purposes. Although preferred materials have been described, it is to be understood that other materials may also be utilized. Furthermore, although the method of the invention has been described with reference to certain preferred embodiments, as will be apparent to those skilled in the art, certain changes and modifications can be made without departing from the scope of the invention as defined by the following claims.

What is claimed is:

1. A method for fabricating an interconnect for testing a semiconductor integrated circuit die comprising:

forming an array of raised contact members on a substrate said contact members sized and spaced to engage electrically conductive contact locations on the die;

forming a first layer of material and a second layer of material on the contact members;

reacting a portion of the first layer of material with a portion of the second layer of material to form a conductive layer on the contact members;

removing an unreacted portion of the first and second layers while leaving the conductive layer; and forming conductive traces on the substrate in contact with the conductive layer.

2. The method as recited in claim 1 and wherein the conductive layer includes a silicide.

3. The method as recited in claim 1 and wherein the first layer is a silicon containing material and the second layer is a metal and the first and second layer are heated to form the conductive layer as a metal silicide.

4. The method as recited in claim 1 and wherein the first layer of material is selected from the group of materials consisting of polysilicon and amorphous silicon.

5. The method as recited in claim 1 and wherein the second layer of material is selected from the group of materials consisting of titanium, platinum, tungsten, cobalt, tantalum, nickel, molybdenum, copper, gold and iridium.

6. The method as recited in claim 1 and wherein the contact members include a projecting apex formed as a knife edge adapted to pierce the contact locations and to provide a stop plane to limit penetration into the contact locations.

7. A method for fabricating an interconnect for testing a semiconductor die comprising:

forming a raised contact member on a substrate said contact member sized and spaced to contact a contact location on the die;

forming a silicon containing layer on the substrate and contact member;

forming an insulating layer on the silicon containing layer;

etching the insulating layer on the contact member;

depositing a metal layer on the silicon containing layer and on the insulating layer;

heating the silicon containing layer and metal layer to form a silicide layer on the contact member;

etching the metal layer, removing the insulating layer, and then etching the silicon containing layer selective to the silicide layer to leave a tip of the contact member covered by the silicide layer; and forming a conductive trace in contact with the silicide layer.

8. The method as recited in claim 7 and wherein the substrate comprises monocrystalline silicon having an insulating layer formed on a surface thereof.

9. The method as recited in claim 7 and wherein the silicon containing layer is selected from the group of materials consisting of doped polysilicon, undoped polysilicon, doped amorphous silicon, and undoped amorphous silicon.

10. The method as recited in claim 7 and wherein the metal layer is selected from the group consisting of titanium, platinum, tungsten, cobalt, tantalum, nickel, molybdenum, copper and gold.

11. The method as recited in claim 7 and wherein the contact member includes a projecting apex formed as a knife edge for piercing the contact location.

12. The method as recited in claim 7 and further comprising annealing the silicide layer to lower its resistivity.

13. The method as recited in claim 7 and further comprising attaching a bond wire to the conductive trace.

14. The method as recited in claim 7 and further comprising forming a plurality of interconnects on a single substrate and then singulating the interconnects.

15. The method as recited in claim 7 and wherein the conductive trace is formed by a metallization process from a metal selected from the group consisting of aluminum, copper, platinum, titanium, tungsten, tantalum, molybdenum and alloys of these metals.

16. The method as recited in claim 7 and further comprising placing the interconnect in a test apparatus for establishing a temporary electrical connection between the die and test circuitry.

17. A method for forming an interconnect for establishing electrical contact with a bond pad of a semiconductor die, comprising:

forming a raised contact member on a substrate having a projecting apex;

forming a first insulating layer on the contact member and substrate;

forming a silicon containing layer on the first insulating layer;

forming a second insulating layer on the silicon containing layer;

forming a mask over the substrate while leaving the contact member exposed;

removing the second insulating layer on the contact member using the mask;

removing the mask;

depositing a metal layer on the contact member and substrate;

heating the metal layer and silicon containing layer to form a silicide layer;

etching the metal layer and the silicon containing layer selective to the silicide layer to form a silicide tip on the contact member;

removing the second insulating layer;

forming a conductive trace in contact with the silicide layer; and attaching a bond wire to the conductive trace.

18. The method as recited in claim 17 and further comprising annealing the silicide layer to lower its resistivity.

19. The method as recited in claim 17 and wherein the projecting apex is formed as a knife edge for penetrating the bond pad and to form a stop plane to limit a penetration into the bond pad.

20. The method as claimed in claim 17 and further comprising forming a plurality of interconnects on a wafer and dicing the wafer to singulate the interconnects.

21. A method for fabricating an interconnect for testing a semiconductor die, said method comprising:

forming a plurality of raised contact members on a substrate said contact members sized and spaced to engage electrically conductive contact locations on the die;

forming a silicon containing layer and a metal layer on the contact members;

reacting the silicon containing layer and the metal layer to form a metal silicide layer;

removing an unreacted portion of the silicon containing layer and an unreacted portion of the metal layer while leaving the metal silicide layer; and forming conductive traces on the substrate in electrical communication with the metal silicide layer.

22. The method as recited in claim 21 and further comprising placing the semiconductor die in a test apparatus and using the raised contact members and conductive traces to establish a temporary electrical connection with the contact locations on the die.

23. The method as recited in claim 21 and further comprising forming an insulating layer between the silicon containing layer and the substrate.

24. The method as recited in claim 21 and wherein the silicon containing layer is formed of a material selected from the group of materials consisting of polysilicon and amorphous silicon.

25. The method as recited in claim 21 and wherein the metal layer is formed of a material selected from the group of materials consisting of titanium, platinum, tungsten, cobalt, tantalum, nickel, molybdenum, copper, gold and iridium.

26. The method as recited in claim 21 and wherein the substrate is formed of a semiconducting material.

27. The method as recited in claim 21 and wherein the substrate is formed of silicon.

28. The method as recited in claim 21 and further comprising annealing the metal silicide layer to lower its resistivity.

29. The method as recited in claim 21 and wherein reacting the silicon containing layer and the metal layer is by heating.

* * * * *